United States Patent
Fust et al.

(10) Patent No.: US 9,698,775 B2
(45) Date of Patent: Jul. 4, 2017

(54) OPERATING DEVICE FOR AN ELECTRICAL APPARATUS, IN PARTICULAR FOR A VEHICLE COMPONENT

(71) Applicant: Behr-Hella Thermocontrol GmbH, Stuttgart (DE)

(72) Inventors: Winfried Fust, Lippstadt (DE); Karsten Marquas, Arnsberg (DE)

(73) Assignee: Behr-Hella Thermocontrol GMBH, Stuttgart (DE)

( * ) Notice: Subject to any disclaimer, the term of this patent is extended or adjusted under 35 U.S.C. 154(b) by 0 days.

(21) Appl. No.: 15/102,693

(22) PCT Filed: Dec. 9, 2014

(86) PCT No.: PCT/EP2014/076989
§ 371 (c)(1),
(2) Date: Jun. 8, 2016

(87) PCT Pub. No.: WO2015/086568
PCT Pub. Date: Jun. 18, 2015

(65) Prior Publication Data
US 2016/0315612 A1    Oct. 27, 2016

(30) Foreign Application Priority Data

Dec. 10, 2013   (DE) .................. 10 2013 225 436

(51) Int. Cl.
*H03K 17/96* (2006.01)
*H03K 17/975* (2006.01)

(52) U.S. Cl.
CPC ......... *H03K 17/962* (2013.01); *H03K 17/975* (2013.01)

(58) Field of Classification Search
CPC ......... H01L 2924/00; H01L 2924/0002; B81B 2203/04; B81B 2203/0118
See application file for complete search history.

(56) References Cited

U.S. PATENT DOCUMENTS

| 6,675,656 B1 | 1/2004 | Ploechinger |
| 2008/0297972 A1* | 12/2008 | Matz ............... H01G 5/18 361/277 |
| 2014/0368465 A1 | 12/2014 | Beilker |

FOREIGN PATENT DOCUMENTS

| DE | 10 2011 089693 A1 | 6/2013 |
| DE | 10 2013 100649 A1 | 8/2013 |

(Continued)

OTHER PUBLICATIONS

International Search Report for corresponding Patent Application No. PCT/EP2014/076989 dated Mar. 6, 2015.

*Primary Examiner* — Sibin Chen
(74) *Attorney, Agent, or Firm* — Renner, Otto, Boisselle & Sklar, LLP

(57) ABSTRACT

The operating device for an electrical apparatus or a system, in particular for a vehicle component, is provided with at least one elastically mounted operating element (12), a counter-element (14), relative to which the at least one operating element (12) is movable when actuated, thereby varying the distance, namely as seen in the movement direction, and at least one capacitor (38) which comprises a first carrier body (20) with a first capacitor electrode (34) and an elastically bendable second carrier body (22), designed as a bending bar, having a first end (26) and a second end (32) opposite said first end and having a second capacitor electrode (36) opposite the first capacitor electrode (34). Connected to the first and second capacitor electrode (34, 36) is an evaluation unit (42) for determining the capacitance and/or a change in the capacitance of the at least one capacitor (38) upon actuation of the at least one operating element (12).

7 Claims, 1 Drawing Sheet

(56) References Cited

FOREIGN PATENT DOCUMENTS

EP  0 759 628 A1  2/1997
WO  2008/145477 A1  12/2008

* cited by examiner

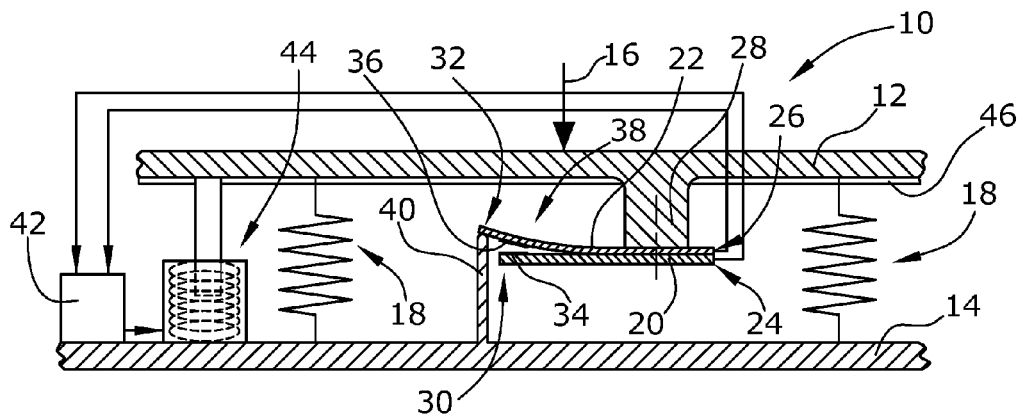
Fig.1
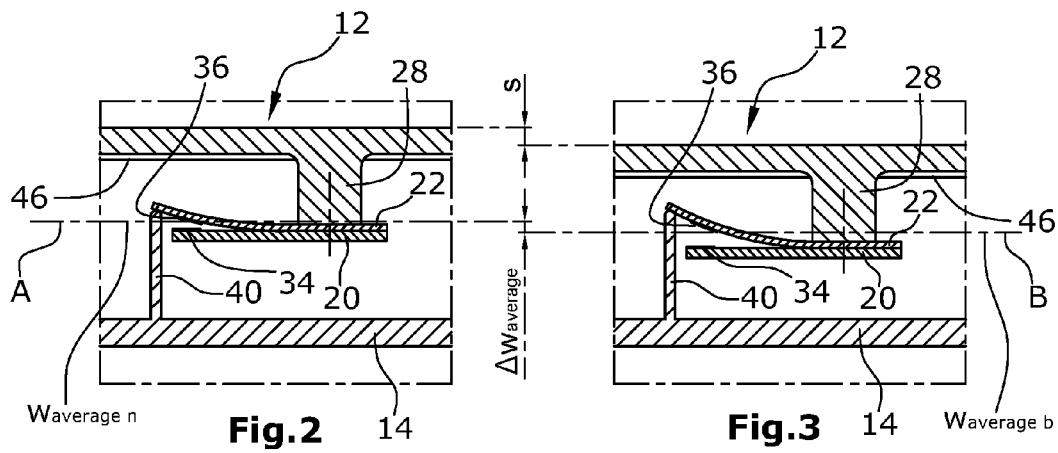
Fig.2  Fig.3
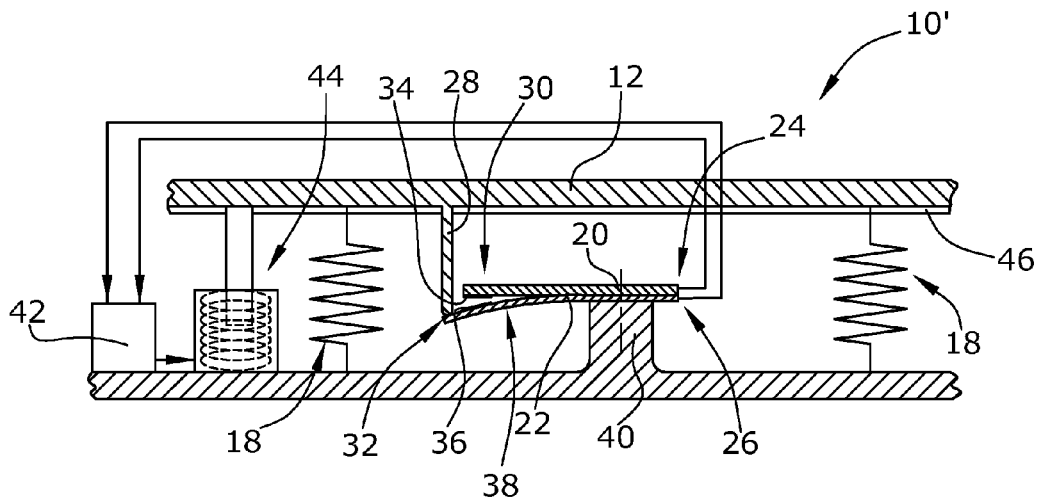
Fig.4

OPERATING DEVICE FOR AN ELECTRICAL APPARATUS, IN PARTICULAR FOR A VEHICLE COMPONENT

The invention relates to an operating device for an electrical apparatus or for a system, said operating device being provided in particular for a vehicle component.

The present application claims the priority of German Patent Application 10 2013 225 436.9 of Dec. 10, 2013, the contents of which are herewith included by reference in the content of the present PCT application.

Operating devices with operating elements of the most various designs are generally known. Particularly in the automotive field, operating concepts have been established wherein use is made of operating elements in the form of keys. Recently, it has been increasingly demanded to design such key-type operating elements to the effect that, when actuated, their surfaces should move, as far as possible, in a manner imperceptible to the user. Thus, it is desired to realize movement strokes as small as possible and, further, to allow these to be detected. On the basis of the path covered, it can then be determined whether the respective operating element has been correctly actuated; thereupon, the function of the device or system that is assigned to the operating element will be performed.

If, in such a system, its resilience (stiffness) is known, the detected displacement/movement of the operating element out of its rest position makes it possible to conclude on the actuating force. In case of a high system stiffness, the displacement is relatively small (which ultimately is even intended in some cases); thus, the challenge arises to find ways for a precise measurement of small displacements.

In DE-A-10 2011 089 693, an operating device is described wherein, in response to a press-down movement, a cut-free bending bar integrated into the circuit board will be deformed. On that end of the bending bar that is not rigidly connected to the circuit board and thus is free, the bending bar carries a capacitor electrode which, together with a further capacitor electrode arranged on the rigid circuit board area facing toward the free end of the bending bar and thus arranged laterally to the free end, forms a capacitor. The change of the capacitance of this capacitor is used for detection of the actuation of the operating element.

DE-A-10 2013 100 649 discloses a touch-type operating element with tactile feedback of a touch of the operating element. Herein, a capacitor is provided whose rigid electrode surfaces will be displaced so that the capacitance will be changed.

Thus, it is an object of the invention to provide an operating device for an electrical apparatus or for a system, particularly for a vehicle component, wherein, in spite of the smallest possible movement strokes of an operating element, a reliable conclusion can be drawn on the movement stroke of this operating element.

To achieve the above object, the invention proposes an operating device for an electrical apparatus or for a system, particularly for a vehicle component, wherein the operating device is provided with at least one elastically mounted operating element,
a counter-element, relative to which the at least one operating element is movable when actuated, thereby varying the distance, namely as seen in the movement direction,
at least one
at least one capacitor which comprises a first carrier body with a first capacitor electrode and an elastically bendable second carrier body, designed as a bending bar, said second carrier body having a second capacitor electrode opposite the first capacitor electrode, wherein
the capacitor is held on the at least one operating element and upon actuation of the operating element can be moved along with the operating element in that the two carrier bodies are fastened by their first ends to the at least one operating element, and the second carrier body on its second end opposite to the first end is in operative connection with the counter-element, for movement of the second end of the elastically bendable second carrier body away from the first carrier body performed upon actuation of the at least one operating element (see e.g. FIG. 1, where the first carrier body and the first end of the elastically bendable second carrier body are fastened to the at least one operating element for movement of the first carrier body and the first end of the elastically bendable second carrier body together with the at least one operating element, and the second end of the second carrier body opposite to the first end of the elastically bendable second carrier body is arranged on the counter-element and, respectively, is supported/held by the latter upon actuation of the at least one operating element and, upon actuation of the at least one operating element, moves away from the first carrier body), or the capacitor is held on the counter-element in that the two carrier bodies are fastened by their first ends to the counter-element, and the second carrier body on its second end opposite to the first end is in operative connection with the at least one operating element, for movement of the second end of the second carrier body away from the second end of the first carrier body performed upon actuation of the at least one operating element (see e.g. FIG. 4, where the first carrier body is held on the counter-element and the at least one operating element is movable relative to the first carrier body, and the elastically bendable second carrier body on its first end is held by the counter-element and, on its second end opposite to the first end, is in operative connection with the at least one operating element for movement of the second end of the elastically bendable second carrier body away from the first carrier body performed upon actuation of the at least one operating element), wherein the second end of the elastically bendable second carrier body undergoes a deflection oriented away from the first carrier body, upon actuation of the at least one operating element and a resultant generation and/or enlargement of a distance between the first and second capacitor electrodes, and an evaluation unit connected to the first and second capacitor electrodes for determining the capacitance and/or a change of the capacitance of the at least one capacitor upon actuation of at least one operating element.

The approach to be realized by the operating device of the invention resides in determining a displacement of the operating element in a capacitive manner in that the change of the capacitance of a capacitor is metrologically detected with the aid of an elastic electrode. The special feature herein resides in that, upon movement of an operating element out of its rest position, the capacitor will change its capacitance from high values to low values. Hence, the capacitor will "open up" when the operating element is actuated.

According to the invention, the operating device comprises at least one elastically supported operating element. In the normal case, this operating element is designed as a key body and can be moved in a translatory manner; however, also deflections of the operating element can be metrologically detected by use of the concept of the invention. The operating element, when actuated, will be moved in the direction of a counter-element and, respectively, the operating element will again move back from said counter-element when no actuating force is exerted on the operating element anymore.

Between the operating element and the counter-element, there is arranged, in the moving path, a capacitor comprising a first and a second carrier body, wherein each carrier body comprises a capacitor electrode (hereunder referred to as a first and respectively second capacitor electrode). While the first carrier body is of a rigid design, the second carrier body is formed in the manner of a bending bar and thus is elastically bendable. The two capacitor electrodes are arranged opposite to each other.

Upon actuation of the operating element, the second carrier body will be deflected to an increasing extent. This will cause an increase of the distance between the two capacitor electrodes which in the rest condition of the operating element should be as small as possible. Thus, notably, in the rest condition of the operating element, the capacitor has a relatively high electrical capacitance which will decrease relatively quickly, particularly also when the operating element is moved only minimally. This relatively large drop of the electrical capacitance of the capacitor can be reliably used for detecting an actuation of the operating element and respectively the displacement path of the operating element and, thus (provided that the stiffness of the system is known), the actuating force.

In case that, for reasons of the design and its tolerances, minimum distances have to be maintained between the electrodes, which normally will result in an air gap that will reduce the capacitance of the capacitor, this invention has the advantage that such a minimum distance needs to be maintained only on one side, namely the side that is opening. On the opposite side, the air gap can be omitted so that the capacitance of the capacitor will be high.

The above mentioned concept of the operating device of the invention can be realized, according to a first alternative, e.g. in that the first carrier body is held immobile relative to the operating element and the at least one operating element is movable relative to the second carrier body, and this elastically bendable second carrier body is by its first end held on the operating element and, on its second end opposite to the first end, is in operative connection with the counter-element upon movement of the elastically bendable second carrier body performed upon actuation of the operating element. In this variant, the first carrier body and the first end of the elastically bendable second carrier body are fastened to the at least one operating element so that, upon actuation of the operating element, both will move along with the latter. In this arrangement, the second end of the elastically bendable second carrier body is in abutment on the counter-element. The two carrier bodies are disposed above each other, wherein the elastically bendable second carrier body is arranged between the operating element and the first carrier body. Consequently, the farther the operating element is moved, the more second carrier body will be defected.

In a second variant of the operating device of the invention, it is provided that the first carrier body and the first end of the elastically bendable second carrier body are held on the counter-element. The second end of the elastically bendable second carrier body is in operative connection with the at least one operating element when the latter is actuated. In this variant, the two carrier bodies again are disposed on top of each other but are held on the counter-element. The second end of the elastically bendable second carrier body is arranged—with respect to the moving direction of the operating element upon actuation—behind the first carrier body and, further, has its second end arranged in abutment on the operating element. Again, upon actuation of the operating element, the second carrier body will be deflected to an increasing extent.

For both variants of the invention, it thus holds true that, upon actuation of the at least one operating element while a distance is generated between the first and second capacitor electrodes and/or said distance is enlarged, the second end of the elastically bendable second carrier body undergoes a deflection directed away from the first carrier body. By means of an evaluation unit connected to the first and second capacitor electrodes, it is now possible to determine the capacitance and/or a change of the capacitance of the at least one capacitor upon actuation of the at least one operating element.

According to a further advantageous embodiment of the invention, there can be provided a feedback unit acting on the at least one operating element for generating a tactile confirmation of an actuation of the at least one operating element, wherein said feedback unit is adapted to be controlled depending on the amount of the capacitance or depending on the degree of the change of capacitance that the capacitor assumes and respectively undergoes upon actuation of the at least one operating element. This feedback can also be given acoustically or visually and, optionally, acoustically and visually in combination and, if desired, additionally in combination with a tactile feedback. A tactile feedback unit can be realized e.g. as a solenoid whose armature can be fastened to the operating element and whose coil with yoke can be fastened to the housing—or vice versa—or as an unbalance motor or vibration unit.

On the at least one elastically supported operating element of the operating device of the invention, there can be arranged a plurality of operating fields with respectively one symbol. Irrespective of which of the operating fields is currently contacted, e.g. by a finger of a hand, for actuating the operating element so that the operating element will be actuated, the operating element will perform a movement which, as described above, will be capacitively detected as provided by the invention. Now, for detecting which operating field is acted on by the finger of a hand when the operating element is actuated, the use of a capacitive touch sensor arrangement is of advantage, its evaluation being formed particularly in the evaluation unit.

The invention will be explained in greater detail hereunder by way of two exemplary embodiments and with reference to the drawing. In the individual figures, the following is shown:

FIG. 1 schematically illustrates the configuration of the movable support of an operating element with capacitive detection of an actuation according to a first exemplary embodiment, FIGS. 2 and 3 are partial views illustrating the operating element concept according to FIG. 1 in the case where the operating element assumes its rest position (see FIG. 2) and upon actuation of the operating element (see FIG. 3), and FIG. 4 schematically illustrates the configuration of the movable support of an operating element with capacitive detection of an actuation according to a second exemplary embodiment.

In FIG. 1, there is shown a first exemplary embodiment of an operating device 10. This operating device 10 comprises an elastically supported operating element 12 which is movable in the direction towards a counter-element 14 and away from the latter when, as indicated at 16 in FIG. 1, an actuating force is acting on the operating element 12 and, respectively, when this actuating force is released. In FIG. 1, the elastic support of operating element 12 is schematically represented by the springs 18.

Fastened to the operating element 12 are a—particularly rigid—first carrier body 20 and elastically bendable second carrier bony 22 superposed arrangement. Said first carrier body 20 can be e.g. a circuit board while the second carrier body 22 can be formed as a strip of sheet metal. As can be seen in FIG. 1, the two carrier bodies 20, 22 are fastened, in the area of their first ends 24, 26, to a projection 28 of the otherwise plate-shaped operating element 12. Said projection 28 is oriented in the direction towards counter-element 14. The two carrier bodies 20, 22 further comprise second ends 30, 32 opposite to their respective first ends 24 and 26, respectively, wherein the end 32 of the elastically bendable second carrier body 22 extends beyond the second end 30 of the first carrier body 20.

In the area of the second end 30 of the first carrier body 20, a first capacitor electrode 34 is arranged. Opposite to said first capacitor electrode, a portion of the second carrier body 22 is located that, within this portion, forms a second capacitor electrode 36. Thus, there is formed a capacitor 38 (with electronically insulated electrodes).

As can be further seen in FIG. 1, the second end 32 of the second carrier body 22 rests on a deflection element 40 of counter-element 14. When, now, the operating element 12 is pressed, i.e. actuated, the second carrier body 22 will increasingly bend due to the abutment of its second end 32 on the deflection element 40, which is evident by a comparison between FIGS. 2 and 3. In FIG. 2, there is shown the situation of the capacitor configuration when the operating element 12 is in its rest position. FIG. 3 shows the case where the operating element 12 is pressed and thus is actuated. This defines the actuation stroke s. The deflection element 40 does not necessarily have to abut on the second end 32 of the second carrier body 22 but can also touch and deflect the second carrier body at another position wherein, for this purpose, the deflection element 40 extends through an opening or the like cutout through the first carrier body 20 so as to come into abutment with the second carrier body 22.

Said actuation stroke s can now be detected on the basis of the changing capacitance of capacitor 38. In FIG. 2, "A" indicates the level of the average electrode distance $W_{average\ n}$ in the situation where the operating element 12 is in its rest position or normal position. In FIG. 3, "B" indicates the level of the average capacitor-electrode distance $W_{average\ b}$ which is reached when the operating element 12 is actuated. The difference between the two levels "A" and "B" is denoted by $\Delta w_{average}$; it can be seen that $\Delta w_{average}$ is smaller than the stroke s, which, however, is not absolutely necessary according to the invention.

In FIG. 1, it is further schematically represented that the two capacitor electrodes 34, 36 are electrically connected to an evaluation unit 42. In this evaluation unit 42, there is performed the detection of the capacitance and respectively the change of capacitance upon actuation of operating element 12. For tactile feedback, a corresponding feedback unit 44 can be provided which comprises an electromechanical drive for causing the operating element 12 to perform vibrations.

In FIG. 4, a concept is shown that is inverse to the actuation detection concept according to FIG. 1. Thus, in the corresponding operating device 10 of FIG. 4, the capacitor 38 and respectively the mutually superposed carrier bodies 20 and 22 will not move along with the operating element 12 when the latter is actuated (except for the bending of the elastically bendable second carrier body 22). Besides, in FIG. 4, those elements that are constructionally and functionally similar to the elements of the operating device 10 of FIG. 1 are marked by the same reference numerals as in FIGS. 1 to 3.

Thus, as evident from the above, the invention makes it possible to detect, through measurement technology, a small displacement with the aid of relatively simple means, namely a circuit board, a sheet-metal strip and a capacitance measurement device. For this purpose, it is merely required that one of the two elements "circuit board" and "sheet-metal strip" can be displaced relative to the other with known stiffness.

Force measurements (or the determining of a force) as rendered possible by the invention are increasingly provided in connection with touch operating functions. Therefore, the hardware and software required for the touch operating functions can be used also for said force measurements. In comparison with known capacitive systems, the change of capacitance relative to the covered path is considerably larger when using the approach provided by the invention, which is achieved because of the physical principle utilized by the invention, so that the accuracy of the force determination is enhanced.

The features of the invention include particularly the following, which can be realized individually and also in any desired combination:

- The decrease of capacitance is used for path measurement.
- In the starting position, the two plates of the capacitor have a smaller distance.
- A strong capacitive change is achieved because:
  - the distance between the boards is enlarged and
  - a second dielectric, which herein is air, will enter into the gap between the capacitor plates.
- One capacitor plate is elastic.
- The air gap between the capacitor plates is formed by the bending of the elastic capacitor plate, e.g. a metal sheet. Thereby, there is effected a mechanical translation between the mechanical displacement of the overall system and the real average change of distance in the capacitor.
- Tolerances of the component parts are compensated by the elasticity of the capacitor metal sheet; by this compensation of tolerances, an idle stroke of the key is avoided, thus making it possible to detect minimal movements within the measurement accuracy.

Hereunder, in a quite general manner, the physical/electrotechnical principles of the inventive approach shall be outlined once more.

The merely minimally displaceable operating element whose displacement is to be metrologically detected, is elastically connected to another component, e.g. to a casing or, as expressed above, a counter-element. The stiffness of this connection (represented in the figures by the springs 18) is known. On the basis of the force/path interrelationship. i.e.

$$F = D \times s,$$

wherein D represents the stiffness and s the path, the applied force F can be calculated with the aid of the displacement S.

The capacitor for path measurement comprises a plane capacitor plate, e.g. a copper conduction path on a circuit board. On this circuit board, also the electronics for measurement of the capacitance are accommodated. In electronic insulation to the first capacitor plate, e.g. a sheet-metal strip is arranged, forming the second capacitor plate. The capacitance of the capacitor is calculated as follows:

$$C = \in_0 \times \in_r \times A/w,$$

wherein $\in_0$ represents the electronic field constant, $\in_r$ represents the relative permeability of the material in the gap (in the normal case, air), A represents the surface area of the capacitor and w represents the distance of the capacitor plates. Now, when a force is applied onto the operating element, there is covered—via the elastic deformation of the springs—the path s. Thus, the (upwardly projecting actuation) pin will be displaced relative to the circuit board with the copper conduction path and relative to the sheet-metal strip. Thereby, the sheet-metal strip will be lifted off the copper conduction path. Due to the one-sided tight clamping attachment, the sheet-metal strip will undergo a corresponding deformation and will form a bending line (see FIGS. 1 to 4). The gap between the copper conduction path on the circuit board and the sheet-metal strip will now have a height which depends on the site on the sheet-metal strip (see FIGS. 2 and 3). Now, when an average distance before and after displacement is detected, this distance is smaller than the displacement s of the operating element. Thus, due to the bending line, the displacement s is translated into the average distance w of the capacitor (see FIGS. 2 and 3).

Since, with increasing path s, the capacitor will open ever further, i.e. the sheet-metal strip will be bent farther away from the circuit board, no actuating forces will be transferred to the circuit board, thus protecting it from damage.

If the path measurement is combined with a haptic feedback which acts in the direction of the actuation, this additional path of the operating element for haptic feedback will open the capacitor still more (see FIGS. 1 to 4).

According to the invention, in contrast to systems working with "closing" capacitors and thus with increasing capacitance, the actuating path provided for actuation and optionally feedback and thus as an "allowance" as is the case in a "closing" capacitor, does not have to be provided, so that the capacitor gap in the rest position can be designed to be very small, thus rendering possible a high output capacitance.

At 46 in FIGS. 1 to 4, there is schematically depicted a capacitive touch sensor system which makes it possible to detect on which site e.g. the finger of a hand is located when the operating element 12 is actuated.

LIST OF REFERENCE NUMERALS 10 operating device
10' operating device
12 operating element
14 counter-force
16 actuating force
18 spring
20 carrier body
22 carrier body
24 first end of first carrier body
26 first end of second carrier body
28 projection
30 second end of first carrier body
32 second end of second carrier body
34 first capacitor electrode
36 second capacitor electrode
38 capacitor
40 deflection element for second carrier body
42 evaluation unit
44 feedback unit
46 touch sensor arrangement
s actuation stroke
w distance
F actuating force

The invention claimed is:

1. An operating device for an electrical apparatus, comprising
at least one elastically mounted operating element,
a counter-element, relative to which the at least one operating element is movable when actuated, thereby causing a change of distance as seen in the movement direction,
at least one capacitor which comprises a first carrier body with a first capacitor electrode and comprises an elastically bendable second carrier body, designed as a bending bar, said second carrier body having a second capacitor electrode,
wherein the two carrier bodies and the two capacitor electrodes are arranged above each other when seen in the moving direction of the operating element,
wherein
the capacitor is held on the at least one operating element and upon actuation of the operating element can be moved along with the operating element in that the two carrier bodies are fastened by their first ends to the at least one operating element, and respectively have a second end opposite to the respective first end, and the second carrier body is in operative connection with the counter-element, for movement of the second end of the elastically bendable second carrier body away from the second end of the first carrier body, upon actuation of the at least one operating element in a direction toward the counter element,
or
the capacitor is held on the counter-element in that the two carrier bodies are fastened by their first ends to the counter-element, and respectively have on a second end opposite to the respective first end, and the second carrier body is in operative connection with the at least one operating element, notably for movement of the second end of the second carrier body away from the second end of the first carrier body upon actuation of the at least one operating element in a direction toward the counter-element,
wherein the second end of the elastically bendable second carrier body undergoes a deflection oriented away from the first carrier body, upon actuation of the at least one operating element and a resultant generation and/or enlargement of a distance between the first and second capacitor electrodes, and
an evaluation unit connected to the first and second capacitor electrodes for determining the capacitance and/or a change of the capacitance of the at least one capacitor upon actuation of at least one operating element.

2. The operating device according to claim 1, comprising a feedback unit acting on the at least one operating element for generating a tactile confirmation of an actuation of the at least one operating element, wherein said feedback unit is adapted to be controlled depending on the amount of the capacitance that the capacitor undergoes upon actuation of at least one operating element, or depending on the degree of the change of capacitance that the capacitor undergoes upon actuation of the at least one operating element.

3. The operating device according to claim 1, wherein the at least one operating element comprises operating fields including a plurality of symbols, wherein, by means of a capacitive touch sensor arrangement, it can be detected in the evaluation unit which one of the operating fields is contacted during actuation of the at least one operating element performed e.g. by a finger of a hand.

4. The operating device according to claim 1, wherein, on the operating element or on the counter-element, a deflection element is arranged which has the second carrier body abutting on it, particularly by the second end of the second carrier body.

5. The operating device according to claim 4, wherein the second end of the second carrier body extends beyond the second end of the first carrier body.

6. The operating device according to claim 4, wherein said deflection element via an opening of the first carrier body is in abutting operative connection with the second carrier body.

7. The operating device according to claim 1, wherein the at least one elastically mounted operating element comprises a manually-operated operating element.

* * * * *